(12) United States Patent
Darveaux et al.

(10) Patent No.: US 8,300,423 B1
(45) Date of Patent: Oct. 30, 2012

(54) STACKABLE TREATED VIA PACKAGE AND METHOD

(75) Inventors: Robert Francis Darveaux, Gilbert, AZ (US); Ludovico Bancod, Chandler, AZ (US); Akito Yoshida, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 234 days.

(21) Appl. No.: 12/787,238

(22) Filed: May 25, 2010

(51) Int. Cl.
*H01R 9/00* (2006.01)
*H01K 1/18* (2006.01)

(52) U.S. Cl. ........ 361/772; 361/761; 361/764; 361/765; 361/774

(58) Field of Classification Search .................. None
See application file for complete search history.

(56) References Cited

U.S. PATENT DOCUMENTS

| | | | |
|---|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |

(Continued)

FOREIGN PATENT DOCUMENTS

JP    05-109975    4/1993

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Boris Chervinsky
(74) *Attorney, Agent, or Firm* — McKay and Hodgson, LLP; Serge J. Hodgson

(57) ABSTRACT

A method of forming a stackable treated via package includes coupling interconnection balls to terminals. The interconnection balls are encapsulated in a package body. Via apertures are formed in the package body to expose the interconnection balls. The interconnection balls are treated to form treated interconnection balls comprising treated surfaces. The treated interconnection balls of the stackable treated via package enhance bonding with interconnection balls of a stacked electronic component package thus maximizing yield.

19 Claims, 12 Drawing Sheets

U.S. PATENT DOCUMENTS

| | | | |
|---|---|---|---|
| 5,247,429 A | 9/1993 | Iwase et al. | |
| 5,250,843 A | 10/1993 | Eichelberger | |
| 5,278,726 A | 1/1994 | Bernardoni et al. | |
| 5,283,459 A | 2/1994 | Hirano et al. | |
| 5,353,498 A | 10/1994 | Fillion et al. | |
| 5,371,654 A | 12/1994 | Beaman et al. | |
| 5,379,191 A | 1/1995 | Carey et al. | |
| 5,404,044 A | 4/1995 | Booth et al. | |
| 5,463,253 A | 10/1995 | Waki et al. | |
| 5,474,957 A | 12/1995 | Urushima | |
| 5,474,958 A | 12/1995 | Djennas et al. | |
| 5,497,033 A | 3/1996 | Fillion et al. | |
| 5,508,938 A | 4/1996 | Wheeler | |
| 5,530,288 A | 6/1996 | Stone | |
| 5,531,020 A | 7/1996 | Durand et al. | |
| 5,546,654 A | 8/1996 | Wojnarowski et al. | |
| 5,574,309 A | 11/1996 | Papapietro et al. | |
| 5,578,934 A * | 11/1996 | Wood et al. | 324/750.05 |
| 5,581,498 A | 12/1996 | Ludwig et al. | |
| 5,582,858 A | 12/1996 | Adamopoulos et al. | |
| 5,616,422 A | 4/1997 | Ballard et al. | |
| 5,637,832 A | 6/1997 | Danner | |
| 5,674,785 A | 10/1997 | Akram et al. | |
| 5,719,749 A | 2/1998 | Stopperan | |
| 5,721,496 A * | 2/1998 | Farnworth et al. | 324/750.05 |
| 5,726,493 A | 3/1998 | Yamashita et al. | |
| 5,739,581 A | 4/1998 | Chillara | |
| 5,739,585 A | 4/1998 | Akram et al. | |
| 5,739,588 A | 4/1998 | Ishida et al. | |
| 5,742,479 A | 4/1998 | Asakura | |
| 5,774,340 A | 6/1998 | Chang et al. | |
| 5,784,259 A | 7/1998 | Asakura | |
| 5,798,014 A | 8/1998 | Weber | |
| 5,822,190 A | 10/1998 | Iwasaki | |
| 5,826,330 A | 10/1998 | Isoda et al. | |
| 5,835,355 A | 11/1998 | Dordi | |
| 5,847,453 A | 12/1998 | Uematsu et al. | |
| 5,883,425 A | 3/1999 | Kobayashi | |
| 5,894,108 A | 4/1999 | Mostafazadeh et al. | |
| 5,903,052 A | 5/1999 | Chen et al. | |
| 5,907,477 A | 5/1999 | Tuttle et al. | |
| 5,915,977 A * | 6/1999 | Hembree et al. | 439/74 |
| 5,924,003 A | 7/1999 | Slocum | |
| 5,936,843 A | 8/1999 | Ohshima et al. | |
| 5,952,611 A | 9/1999 | Eng et al. | |
| 6,004,619 A | 12/1999 | Dippon et al. | |
| 6,013,948 A | 1/2000 | Akram et al. | |
| 6,021,564 A | 2/2000 | Hanson | |
| 6,028,364 A | 2/2000 | Ogino et al. | |
| 6,034,427 A | 3/2000 | Lan et al. | |
| 6,035,527 A | 3/2000 | Tamm | |
| 6,040,239 A * | 3/2000 | Akram et al. | 438/612 |
| 6,040,622 A | 3/2000 | Wallace | |
| 6,060,778 A | 5/2000 | Jeong et al. | |
| 6,069,407 A | 5/2000 | Hamzehdoost | |
| 6,072,243 A | 6/2000 | Nakanishi | |
| 6,081,036 A | 6/2000 | Hirano et al. | |
| 6,119,338 A | 9/2000 | Wang et al. | |
| 6,122,171 A | 9/2000 | Akram et al. | |
| 6,127,833 A | 10/2000 | Wu et al. | |
| 6,160,705 A | 12/2000 | Stearns et al. | |
| 6,172,419 B1 | 1/2001 | Kinsman | |
| 6,175,087 B1 | 1/2001 | Keesler et al. | |
| 6,184,463 B1 | 2/2001 | Panchou et al. | |
| 6,194,250 B1 | 2/2001 | Melton et al. | |
| 6,204,453 B1 | 3/2001 | Fallon et al. | |
| 6,214,641 B1 | 4/2001 | Akram | |
| 6,235,554 B1 | 5/2001 | Akram et al. | |
| 6,239,485 B1 | 5/2001 | Peters et al. | |
| D445,096 S | 7/2001 | Wallace | |
| D446,525 S | 8/2001 | Okamoto et al. | |
| 6,274,821 B1 | 8/2001 | Echigo et al. | |
| 6,280,641 B1 | 8/2001 | Gaku et al. | |
| 6,316,285 B1 | 11/2001 | Jiang et al. | |
| 6,351,031 B1 | 2/2002 | Iijima et al. | |
| 6,353,999 B1 | 3/2002 | Cheng | |
| 6,365,975 B1 | 4/2002 | DiStefano et al. | |
| 6,376,906 B1 | 4/2002 | Asai et al. | |
| 6,392,160 B1 | 5/2002 | Andry et al. | |
| 6,395,578 B1 | 5/2002 | Shin et al. | |
| 6,405,431 B1 | 6/2002 | Shin et al. | |
| 6,406,942 B2 | 6/2002 | Honda | |
| 6,407,341 B1 | 6/2002 | Anstrom et al. | |
| 6,407,930 B1 | 6/2002 | Hsu | |
| 6,448,510 B1 | 9/2002 | Neftin et al. | |
| 6,451,509 B2 | 9/2002 | Keesler et al. | |
| 6,479,762 B2 | 11/2002 | Kusaka | |
| 6,497,943 B1 | 12/2002 | Jimarez et al. | |
| 6,517,995 B1 | 2/2003 | Jacobson et al. | |
| 6,534,391 B1 | 3/2003 | Huemoeller et al. | |
| 6,544,461 B1 * | 4/2003 | Hembree et al. | 264/272.17 |
| 6,544,638 B2 | 4/2003 | Fischer et al. | |
| 6,586,682 B2 | 7/2003 | Strandberg | |
| 6,608,757 B1 | 8/2003 | Bhatt et al. | |
| 6,660,559 B1 | 12/2003 | Huemoeller et al. | |
| 6,715,204 B1 | 4/2004 | Tsukada et al. | |
| 6,727,645 B2 | 4/2004 | Tsujimura et al. | |
| 6,730,857 B2 | 5/2004 | Konrad et al. | |
| 6,734,542 B2 | 5/2004 | Nakatani et al. | |
| 6,740,964 B2 | 5/2004 | Sasaki | |
| 6,753,612 B2 | 6/2004 | Adae-Amoakoh et al. | |
| 6,774,748 B1 | 8/2004 | Ito et al. | |
| 6,787,443 B1 | 9/2004 | Boggs et al. | |
| 6,803,528 B1 | 10/2004 | Koyanagi | |
| 6,815,709 B2 | 11/2004 | Clothier et al. | |
| 6,815,739 B2 | 11/2004 | Huff et al. | |
| 6,838,776 B2 | 1/2005 | Leal et al. | |
| 6,888,240 B2 | 5/2005 | Towle et al. | |
| 6,919,514 B2 | 7/2005 | Konrad et al. | |
| 6,921,968 B2 | 7/2005 | Chung | |
| 6,921,975 B2 | 7/2005 | Leal et al. | |
| 6,931,726 B2 | 8/2005 | Boyko et al. | |
| 6,953,995 B2 | 10/2005 | Farnworth et al. | |
| 6,987,314 B1 | 1/2006 | Yoshida et al. | |
| 7,015,075 B2 | 3/2006 | Fay et al. | |
| 7,030,469 B2 | 4/2006 | Mahadevan et al. | |
| 7,081,661 B2 | 7/2006 | Takehara et al. | |
| 7,125,744 B2 | 10/2006 | Takehara et al. | |
| 7,129,113 B1 * | 10/2006 | Lin et al. | 438/109 |
| 7,185,426 B1 | 3/2007 | Hiner et al. | |
| 7,198,980 B2 | 4/2007 | Jiang et al. | |
| 7,242,081 B1 | 7/2007 | Lee | |
| 7,282,394 B2 | 10/2007 | Cho et al. | |
| 7,285,855 B2 | 10/2007 | Foong | |
| 7,345,361 B2 | 3/2008 | Mallik et al. | |
| 7,372,151 B1 | 5/2008 | Fan et al. | |
| 7,429,786 B2 | 9/2008 | Karnezos et al. | |
| 7,459,202 B2 | 12/2008 | Magera et al. | |
| 7,548,430 B1 | 6/2009 | Huemoeller et al. | |
| 7,550,857 B1 | 6/2009 | Longo et al. | |
| 7,633,765 B1 | 12/2009 | Scanlan et al. | |
| 7,671,457 B1 | 3/2010 | Hiner et al. | |
| 7,777,351 B1 | 8/2010 | Berry et al. | |
| 2002/0017712 A1 | 2/2002 | Bessho et al. | |
| 2002/0061642 A1 | 5/2002 | Haji et al. | |
| 2002/0066952 A1 | 6/2002 | Taniguchi et al. | |
| 2002/0195697 A1 | 12/2002 | Mess et al. | |
| 2003/0025199 A1 | 2/2003 | Wu et al. | |
| 2003/0128096 A1 | 7/2003 | Mazzochette | |
| 2003/0141582 A1 | 7/2003 | Yang et al. | |
| 2003/0197284 A1 | 10/2003 | Khiang et al. | |
| 2004/0063246 A1 | 4/2004 | Karnezos | |
| 2004/0145044 A1 | 7/2004 | Sugaya et al. | |
| 2004/0159462 A1 | 8/2004 | Chung | |
| 2005/0139985 A1 | 6/2005 | Takahashi | |
| 2005/0242425 A1 | 11/2005 | Leal et al. | |
| 2007/0273049 A1 | 11/2007 | Khan et al. | |
| 2007/0281471 A1 | 12/2007 | Hurwitz et al. | |
| 2007/0290376 A1 | 12/2007 | Zhao et al. | |
| 2008/0230887 A1 | 9/2008 | Sun et al. | |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

Darveaux et al., "Stackable Package and Method", U.S. Appl. No. 12/917,185, filed Nov. 1, 2010.

Kim et al., "Semiconductor Device and Fabricating Method Thereof", U.S. Appl. No. 12/943,540, filed Nov. 10, 2010.

\* cited by examiner

Stackable treated via package formation method 100

STACKABLE TREATED VIA PACKAGE AND METHOD

TECHNICAL FIELD

The present application relates to the field of electronics, and more particularly, to methods of forming electronic component packages and related structures.

BACKGROUND

To form a stacked electronic component assembly, a stacked electronic component package is mounted to a lower electronic component package. Due to inadvertent warpage in either the stacked electronic component package or the lower electronic component package, failure in the solder interconnections between the stacked electronic component package and the lower electronic component package can occur during solder reflow. Failure of the solder interconnections requires rework or scraping of the electronic component assembly.

BRIEF DESCRIPTION OF THE DRAWINGS

In the following description, the same or similar elements are labeled with the same or similar reference numbers.

DETAILED DESCRIPTION

Figure 1:
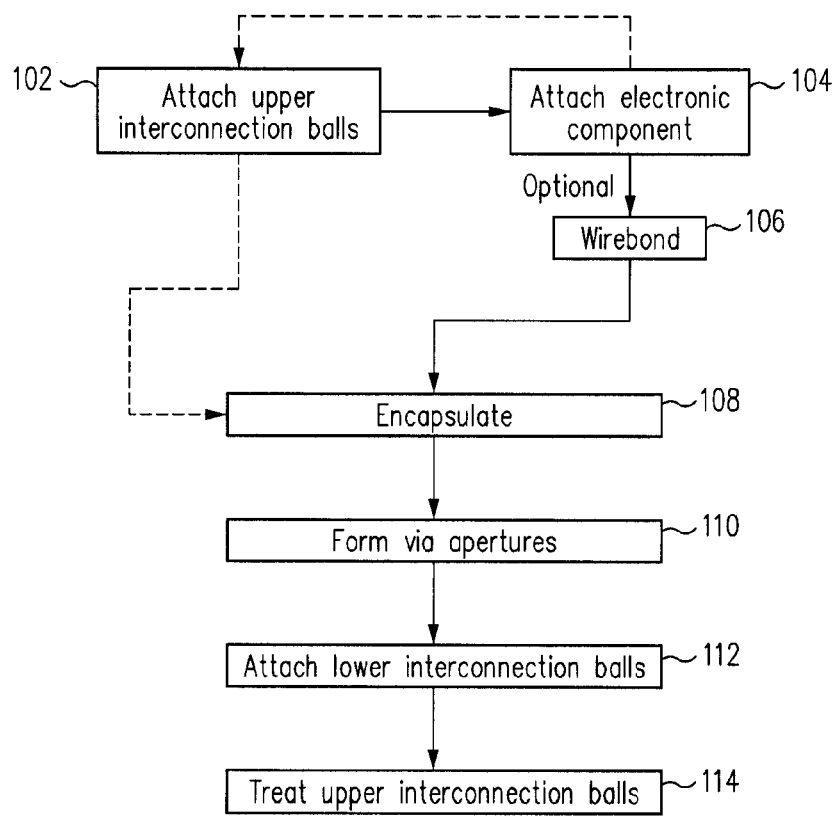
FIG. 1 is a block diagram of a stackable treated via package formation method in accordance with one embodiment.
Figure 2:
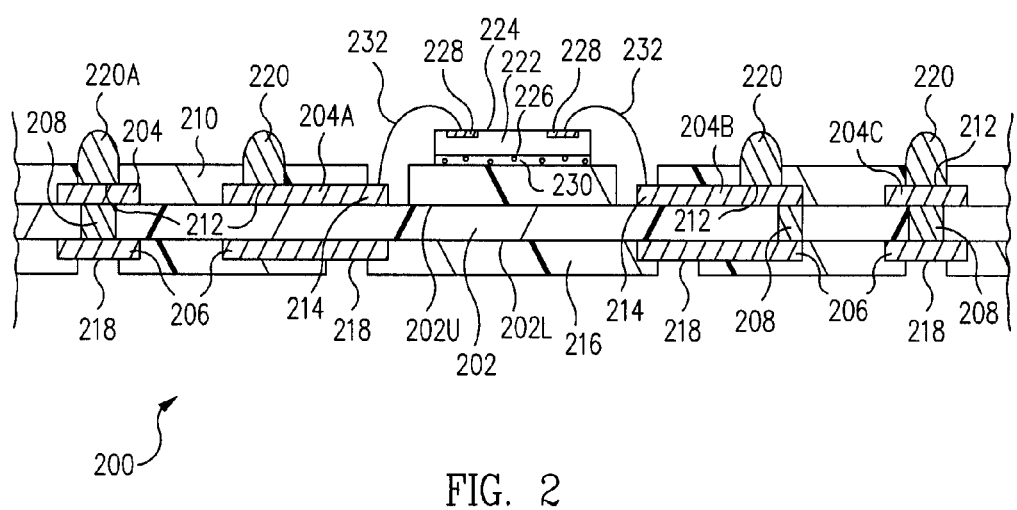
FIG. 2 is a cross-sectional view of a stackable treated via package during fabrication in accordance with one embodiment.

As an overview and in accordance with one embodiment, a stackable treated via package formation method 100 (FIG. 1) of forming a stackable treated via package 200 (FIG. 2) is presented. Referring now to FIGS. 1 and 2 together, interconnection balls 220 are attached to terminals 212 in an attach upper interconnection balls operation 102.

Figure 3:
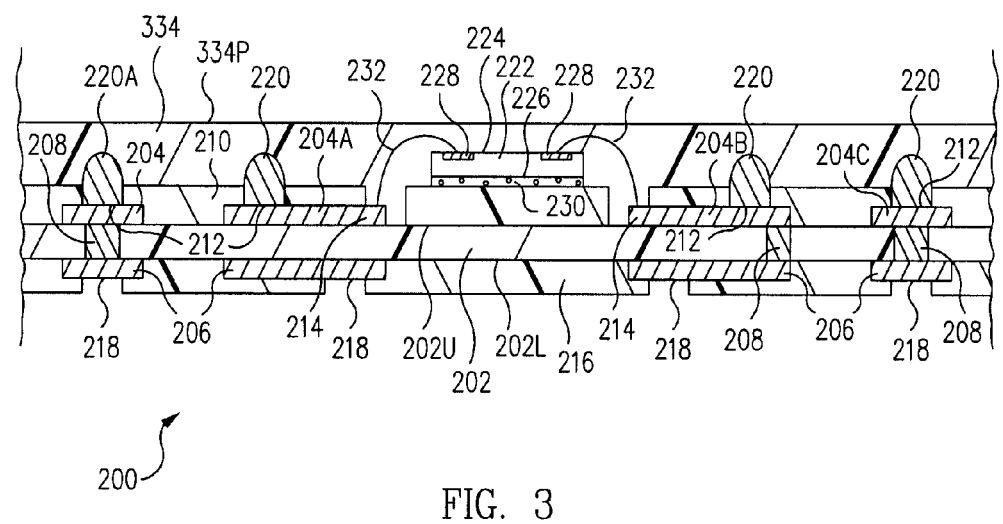
FIGS. 3, 4, 5 are cross-sectional views of the stackable treated via package of FIG. 2 at later stages during fabrication in accordance with various embodiments.
Figure 4:
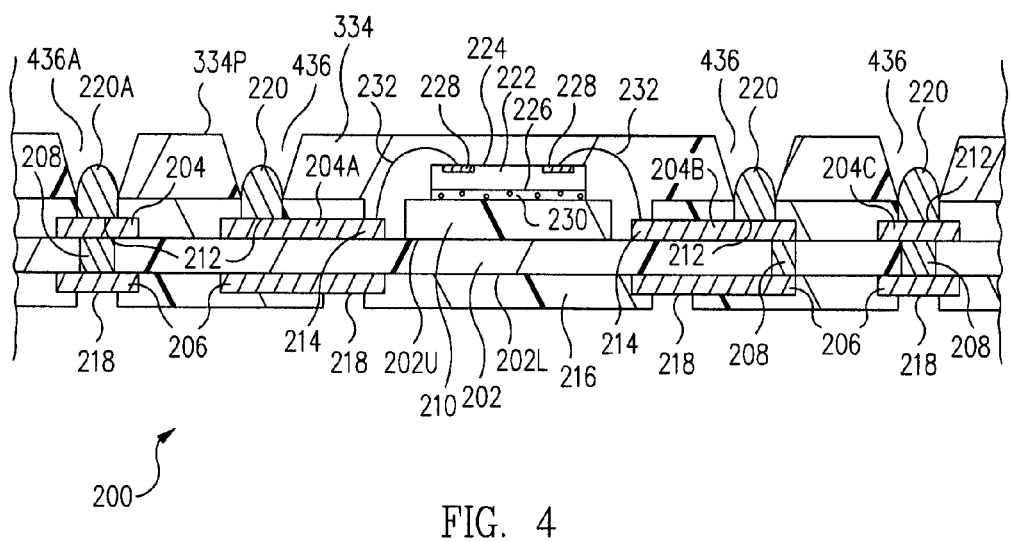

Referring now to FIGS. 1 and 3 together, interconnection balls 220 are encapsulated in a package body 334 in an encapsulate operation 108. Referring now to FIGS. 1 and 4 together, via apertures 436 are formed in package body 334 to expose interconnection balls 220 in a form via apertures operation 110.

Figure 5:
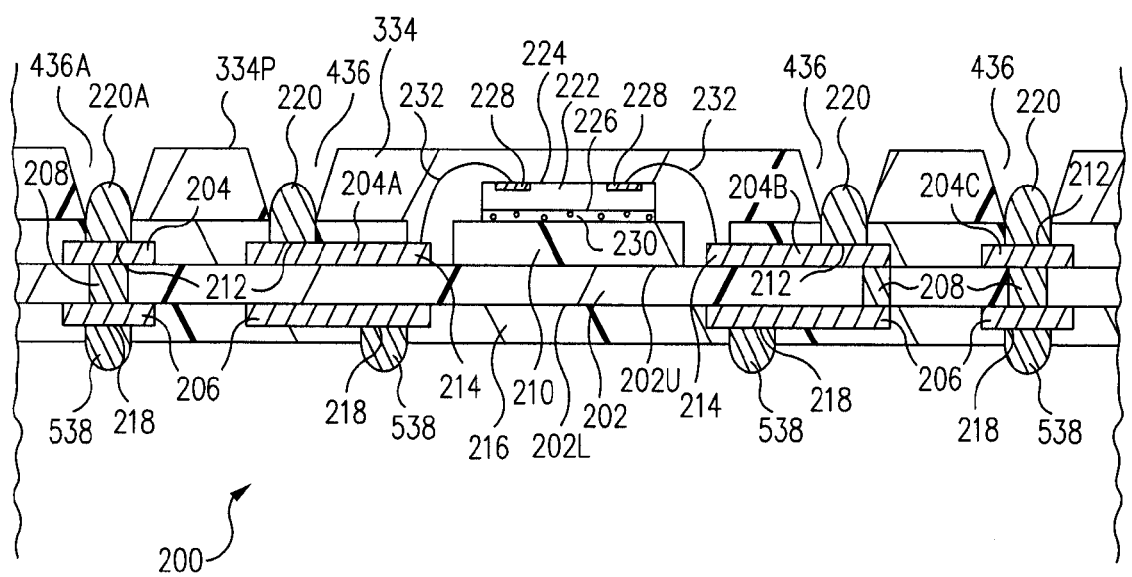
Figure 6:
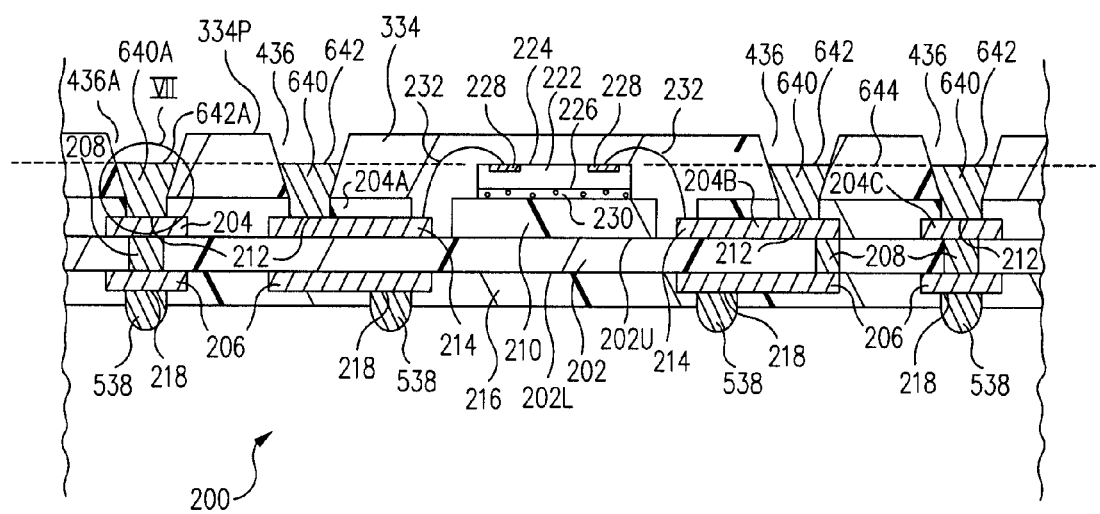
FIG. 6 is a cross-sectional view of the stackable treated via package of FIG. 5 at a later stage during fabrication in accordance with one embodiment.

Referring now to FIGS. 1, 5, and 6 together, in one embodiment, interconnection balls 220 (FIG. 5) are flattened to form treated interconnection balls 640 (FIG. 6) in a treat upper interconnection balls operation 114. Treated interconnection balls 640 include flat surfaces 642 lying in a planar seating plane 644.

Figure 10:
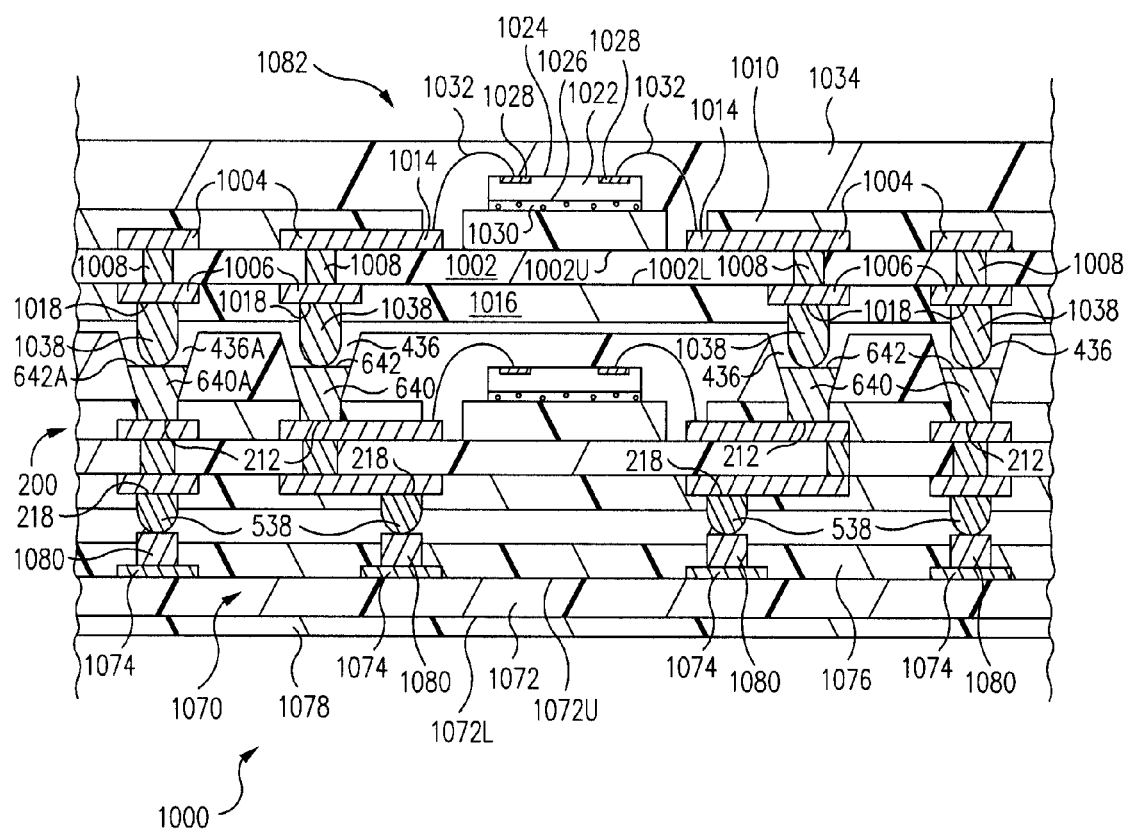
FIG. 10 is a cross-sectional view of an electronic component assembly including the stackable treated via package of FIGS. 6, 7 during fabrication in accordance with one embodiment.

Referring to FIG. 10, coplanar flat surfaces 642 enhance contact between lower interconnection balls 1038 of a stacked electronic component package 1082 and treated interconnection balls 640 thus enhancing bonding therebetween and yield. In one embodiment, treated interconnection balls 640 dome up during reflow further enhancing bonding with lower interconnection balls 1038 of stacked electronic component package 1082.

Figure 8:
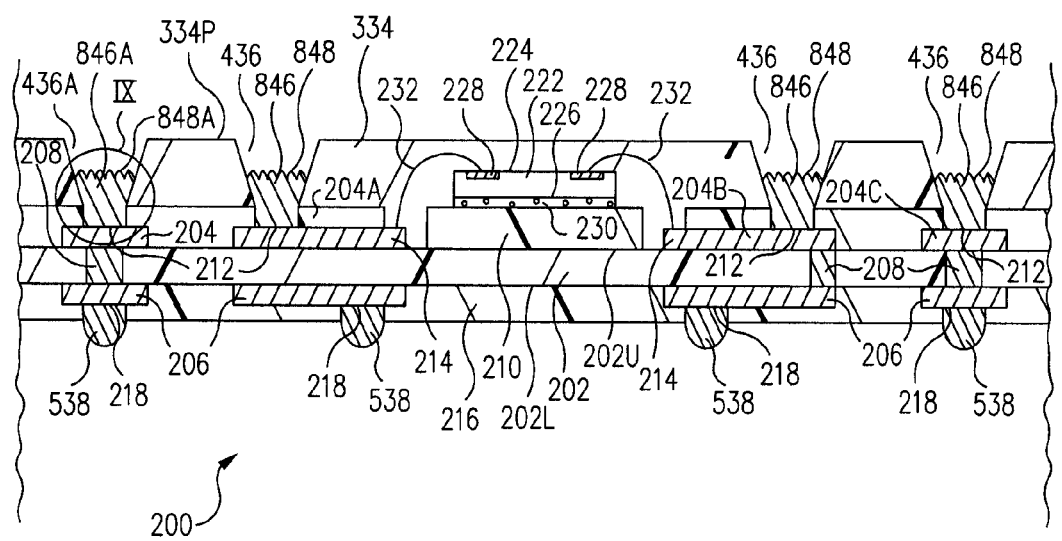
FIG. 8 is a cross-sectional view of the stackable treated via package of FIG. 5 at a later stage during fabrication in accordance with another embodiment.

Referring now to FIGS. 1, 5, and 8 together, in another embodiment, interconnection balls 220 (FIG. 5) are deformed to form treated interconnection balls 846 (FIG. 8) in treat upper interconnection balls operation 114. In accordance with this embodiment, treated interconnection balls 846 comprise jagged surfaces 848. During reflow, treated interconnection balls 846, i.e., jagged surfaces 848, break the oxide layer of the lower interconnection balls of a stacked electronic component package thus enhancing bonding therewith and maximizing yield.

Now in more detail, FIG. 1 is a block diagram of a stackable treated via package formation method 100 in accordance with one embodiment. FIG. 2 is a cross-sectional view of a stackable treated via package 200 during fabrication in accordance with one embodiment. Paying particular attention to FIG. 2, stackable treated via package 200, sometimes called an electronic component package, includes a substrate 202 including an upper, e.g., first, surface 202U and an opposite lower, e.g., second, surface 202L. Substrate 202 is a dielectric material such as laminate, ceramic, printed circuit board material, or other dielectric material.

Formed on upper surface 202U of substrate 202 are electrically conductive upper, e.g., first, traces 204, e.g., formed of copper. Formed on lower surface 202L of substrate 202 are lower, e.g., second, traces 206. Lower traces 206 are electrically connected to upper traces 204 by electrically conductive vias 208 extending through substrate 202 between upper surface 202U and lower surface 202L.

Stackable treated via package 200 further includes an upper, e.g., first, solder mask 210 on upper surface 202U that protects first portions of upper traces 204 while exposing second portions, e.g., terminals 212 and/or bond fingers 214, of upper traces 204.

Stackable treated via package 200 further includes a lower, e.g., second, solder mask 216 on lower surface 202L that protects first portions of lower traces 206 while exposing second portions, e.g., terminals 218, of lower traces 206.

Referring now to FIGS. 1 and 2 together, in an attach upper interconnection balls operation 102, electrically conductive upper, e.g., first, interconnection balls 220 are attached to terminals 212 of upper traces 204. Illustratively, upper interconnection balls 220 are formed of solder. In other embodiments, upper interconnection balls 220 are formed of other electrically conductive material such as plated copper or electrically conductive adhesive. As illustrated, upper interconnection balls 220 are approximately spherical and the exposed upper surfaces of upper interconnection balls 220 are thus sometime called convex surfaces.

From attach upper interconnection balls operation 102, flow moves to an attach electronic component operation 104. In attach electronic component operation 104, an electronic component 222 is attached.

In one embodiment, electronic component 222 is an integrated circuit chip, e.g., an active component. However, in other embodiments, electronic component 222 is a passive component such as a capacitor, resistor, or inductor. In another embodiment, electronic component 222 is a prepackaged device. In yet another embodiment, a plurality of electronic components are mounted, e.g., in a stacked configuration.

In accordance with this embodiment, electronic component 222 includes an active surface 224 and an opposite inactive surface 226. Electronic component 222 further includes bond pads 228 formed on active surface 224.

Inactive surface 226 is mounted to upper solder mask 210 with an adhesive 230, sometimes called a die attach adhesive. In another embodiment, upper solder mask 210 is patterned to expose a portion of upper surface 202U of substrate 202 and inactive surface 226 is mounted to the exposed portion of upper surface 202U of substrate 202 with adhesive 230. Generally, electronic component 222 is mounted to substrate 202.

From attach electronic component operation 104, flow moves to a wirebond operation 106. In wirebond operation 106, bond pads 228 are electrically connected to upper traces 204, e.g., bond fingers 214 thereof, by electrically conductive bond wires 232.

Although electronic component 222 is illustrated and described as being mounted in a wirebond configuration, in other embodiments, electronic component 222 is mounted in a different configuration such as a flip chip configuration. In a flip chip configuration, flip chip bumps, e.g., solder, form the physical and electrical connections between bond pads 228 and upper traces 204, e.g., bond fingers 214 thereof, as discussed below in reference to FIG. 2A. Thus, wirebond operation 106 is optional, e.g., is not performed in the case when electronic component 222 is mounted in a flip chip configuration or other configuration not requiring bond wires 232.

Although a particular electrically conductive pathway between bond pads 228 and lower traces 206 is described above, other electrically conductive pathways can be formed. For example, contact metallizations can be formed between the various electrical conductors.

Further, instead of straight though vias 208, in one embodiment, substrate 202 is a multilayer substrate and a plurality of vias and/or internal traces form the electrical interconnection between upper traces 204 and lower traces 206.

In accordance with one embodiment, one or more of upper traces 204 is not electrically connected to lower traces 206, i.e., is electrically isolated from lower traces 206, and electrically connected to bond pads 228. To illustrate, a first upper trace 204A of the plurality of upper traces 204 is electrically isolated from lower traces 206 and electrically connected to a respective bond pad 228. In accordance with this embodiment, the respective bond pad 228 electrically connected to upper trace 204A is also electrically isolated from lower traces 206.

In accordance with one embodiment, one or more of upper traces 204 is electrically connected to both bond pads 228 and to lower traces 206. To illustrate, a second upper trace 204B of the plurality of upper traces 204 is electrically connected to lower trace(s) 206 by a via 208. In accordance with this embodiment, the respective bond pad 228 electrically connected to upper trace 204B is also electrically connected to lower trace(s) 206.

In accordance with one embodiment, one or more of upper traces 204 is not electrically connected to a bond pad 228, i.e., is electrically isolated from bond pads 228, and is electrically connected to lower traces 206. To illustrate, a third upper trace 204C is electrically isolated from bond pads 228 and electrically connected to lower trace(s) 206. In accordance with this embodiment, the respective lower trace(s) 206 electrically connected to upper trace 204C are also electrically isolated from bond pads 228.

As set forth above, in accordance with various embodiments, upper traces 204 are electrically connected to lower traces 206, to bond pads 228, and/or to lower traces 206 and bond pads 228. Thus, in accordance with various embodiments, upper interconnection balls 220 are electrically connected to lower traces 206 only, to bond pads 228 only, and/or to both lower traces 206 and bond pads 228.

Although various examples of connections between bond pads 228, upper traces 204, lower traces 206, and upper interconnection balls 220 are set forth above, in light of this disclosure, those of skill in the art will understand that any one of a number of electrical configurations are possible depending upon the particular application.

Figure 2A:
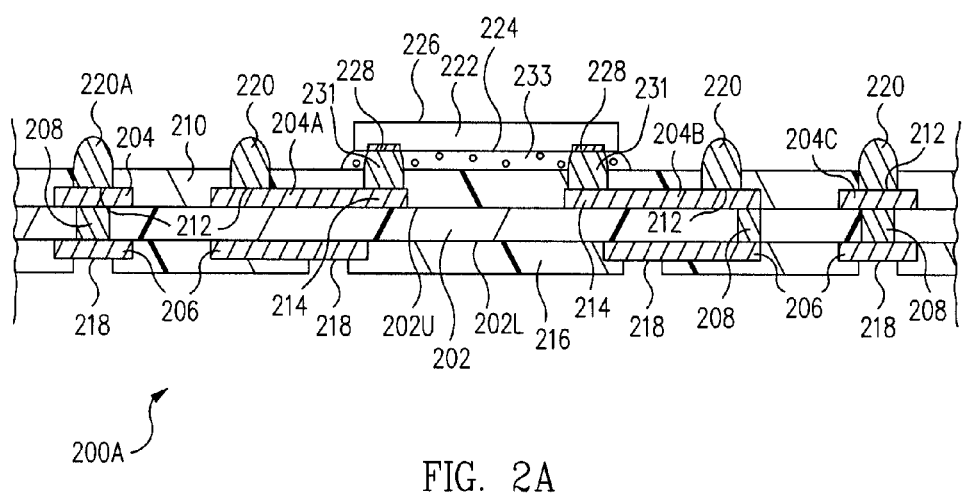
FIG. 2A is a cross-sectional view of a stackable treated via package during fabrication in accordance with another embodiment.

FIG. 2A is a cross-sectional view of a stackable treated via package 200A during fabrication in accordance with another embodiment. Stackable treated via package 200A of FIG. 2A is similar to stackable treated via package 200 of FIG. 2 and only the significant differences are discussed below.

Referring now to FIG. 2A, in accordance with this embodiment, electronic component 222 is mounted in a flip chip configuration. More particularly, flip chip bumps 231, e.g., solder, form the physical and electrical connections between bond pads 228 and upper traces 204, e.g., bond fingers 214 thereof. Optionally, an underfill 233 is applied between active surface 224 of electronic component 222 and upper solder mask 210 (or upper surface 202U of substrate 202) and encloses and protects flip chip bumps 231.

Referring now to FIGS. 1 and 2A together, in accordance with one embodiment as indicated by the dashed arrows in FIG. 1, attach electronic component operation 104 is performed prior to attach upper interconnection balls operation 102. Accordingly, electronic component 222 is flip chip mounted with flip chip bumps 231 first and then upper interconnection balls 220 are attached to terminals 212. Further, wirebond operation 106 is not performed and flow moves directly from attach upper interconnection balls operation 102 to an encapsulate operation 108.

In yet another embodiment, attach electronic component operation 104 is performed simultaneously with attach upper interconnection balls operation 102. Accordingly, upper interconnection balls 220 are attached to terminals 212 and electronic component 222 is flip chip mounted with flip chip bumps 231 simultaneously, e.g., in a single reflow operation. Further, wirebond operation 106 is not performed and flow moves directly from both attach upper interconnection balls operation 102 and attach electronic component operation 104 to encapsulate operation 108.

Although stackable treated via package 200 of FIG. 2 is illustrated in the following figures, in light of this disclosure, those of skill in the art will understand that the operations can equally be performed with stackable treated via package 200A of FIG. 2A.

FIG. 3 is a cross-sectional view of stackable treated via package 200 of FIG. 2 at a later stage during fabrication in accordance with one embodiment. Referring now to FIGS. 1 and 3 together, from wirebond operation 106, flow moves to encapsulate operation 108. In encapsulate operation 108, electronic component 222, bond wires 232, upper interconnection balls 220, upper solder mask 210 and any exposed portions of upper surface 202U and/or upper traces 204 are enclosed, sometimes called encased, encapsulated, and/or covered, with a package body 334.

Illustratively, package body 334 is a cured liquid encapsulant, molding compound, or other dielectric material. Package body 334 protects electronic component 222, bond wires 232, upper interconnection balls 220, upper solder mask 210 and any exposed portions of upper surface 202U and/or upper traces 204 from the ambient environment, e.g., from contact, moisture and/or shorting to other structures.

Package body 334 includes a principal surface 334P parallel to upper surface 202U of substrate 202. Although the terms parallel, perpendicular, and similar terms are used herein, it is to be understood that the described features may not be exactly parallel and perpendicular, but only substantially parallel and perpendicular to within excepted manufacturing tolerances.

FIG. 4 is a cross-sectional view of stackable treated via package 200 of FIG. 3 at a later stage during fabrication in accordance with one embodiment. Referring now to FIGS. 1 and 4 together, from encapsulate operation 108, flow moves to a form via apertures operation 110. In form via apertures operation 110, via apertures 436 are formed in package body 334.

Via apertures 436 penetrate into package body 334 from principal surface 334P to expose upper interconnection balls 220. Each via aperture 436 exposes a respective interconnection ball 220 on a respective terminal 212.

In one embodiment, via aperture 436 are formed using a laser-ablation process. More particularly, a laser is repeatedly directed at principal surface 334P perpendicularly to principal surface 334P. This laser ablates, i.e., removes, portions of package body 334 leaving via apertures 436, sometimes called through holes.

Although a laser-ablation process for formation of via apertures 436 is set forth above, in other embodiments, other via aperture formation techniques are used. For example, via apertures 436 are formed using selective molding, milling, mechanical drilling, chemical etching and/or other via aperture formation techniques.

To further illustrate, a first via aperture 436A of the plurality of via apertures 436 extends between principal surface 334P of package body 334 and a first upper interconnection ball 220A of upper interconnection balls 220. Accordingly, upper interconnection ball 220A is exposed through via aperture 436A.

Via aperture 436A tapers from principal surface 334P to upper interconnection ball 220A. More particularly, the diameter of via aperture 436A in a plane parallel to principal surface 334P is greatest at the top of via aperture 436A, and smallest at the bottom of via aperture 436A and gradually diminishes between the top and bottom of via aperture 436A. The top of via aperture 436A is located at principal surface 334P and the bottom of via aperture 436 is located at upper interconnection ball 220A in this embodiment.

In another embodiment, via aperture 436A has a uniform diameter, i.e., has a cylindrical shape. In yet another embodiment, via aperture 436A tapers from the bottom to the top of via aperture 436A. More particularly, the diameter of via aperture 436A in a plane parallel to principal surface 334P is smallest at the top of via aperture 436A and greatest at the bottom of via aperture 436A and gradually increases between the top and bottom of via aperture 436A.

Although only a single via aperture 436A is described in detail, in light of this disclosure, those of skill in the art will understand that the description is equally applicable to all of via apertures 436.

FIG. 5 is a cross-sectional view of stackable treated via package 200 of FIG. 4 at a later stage during fabrication in accordance with one embodiment. Referring now to FIGS. 1 and 5 together, from form via apertures operation 110, flow moves to an attach lower interconnection balls operation 112. In attach lower interconnection balls operation 112, lower, e.g., second, interconnection balls 538 are attached to lower traces 206, e.g., terminals 218 thereof.

Illustratively, lower interconnection balls 538 are formed of solder. In other embodiments, lower interconnection balls 538 are formed of other electrically conductive material such as plated copper or electrically conductive adhesive.

In one embodiment, lower interconnection balls 538 are distributed in an array forming a Ball Grid Array (BGA). Illustratively, lower interconnection balls 538 are used to connect stackable treated via package 200 to other structures such as a larger substrate, e.g., a printed circuit motherboard.

Although attach lower interconnection balls operation 112 is set forth at a particular stage during fabrication of stackable treated via package 200, in other embodiments, attach lower interconnection balls operation 112 is performed at an earlier or later stage during fabrication of stackable treated via package 200.

Figure 7:
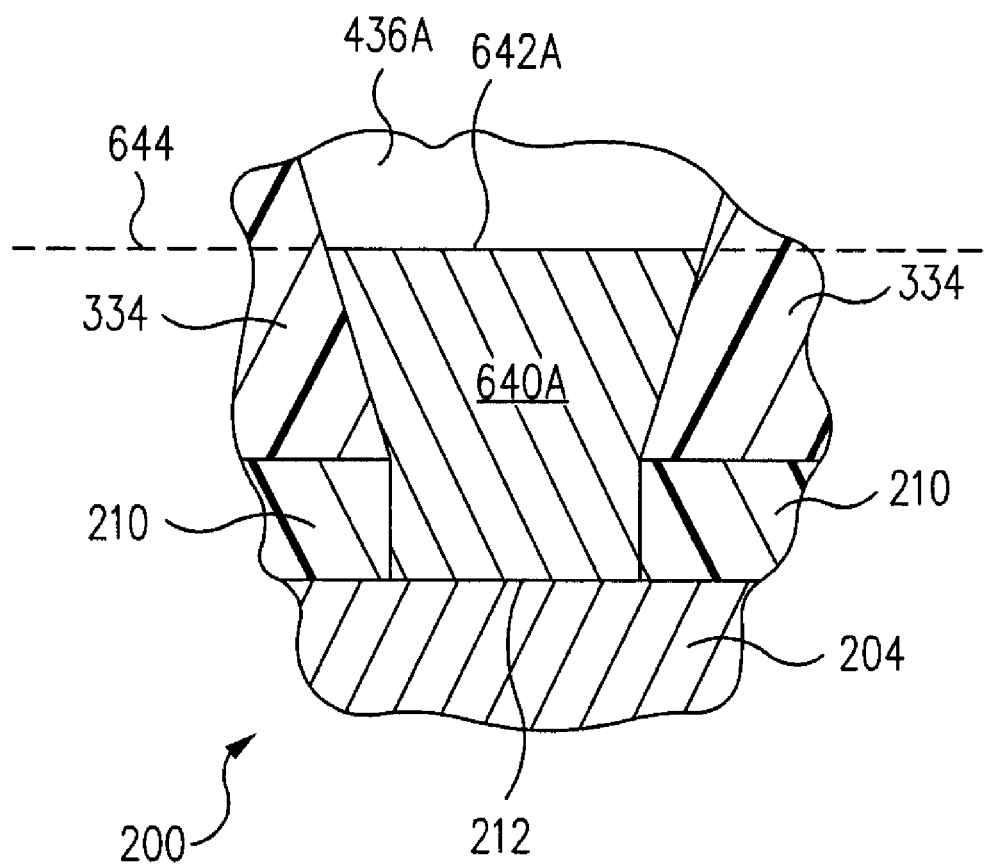
FIG. 7 is an enlarged cross-sectional view of the region VII of the stackable treated via package of FIG. 6.

FIG. 6 is a cross-sectional view of stackable treated via package 200 of FIG. 5 at a later stage during fabrication in accordance with one embodiment. FIG. 7 is an enlarged cross-sectional view of the region VII of stackable treated via package 200 of FIG. 6.

Referring now to FIGS. 1, 5, 6, and 7 together, from attach lower interconnection balls operation 112, flow moves to a treat upper interconnection balls operation 114. In treat upper interconnection balls operation 114, upper interconnection balls 220 (FIG. 5) are treated to form treated interconnection balls 640 as illustrated in FIGS. 6 and 7. Treated interconnection balls 640 include a first treated interconnection ball 640A.

More particularly, upper interconnection balls 220 (FIG. 5) are flattened to form treated interconnection balls 640. Accordingly, treated interconnection balls 640 include upper, e.g., first, flat surfaces 642. To illustrate, treated interconnection ball 640A includes a first flat surface 642A of the plurality of flat surfaces 642. Flat surfaces 642 are sometimes called treated surfaces.

In one embodiment, a jig includes a plurality of flat ended pins. The flat ended pins are passed through via apertures 436 and pressed downward on upper interconnection balls 220 to simultaneously flatten all of upper interconnection balls 220 (FIG. 5) to form treated interconnection balls 640.

Illustratively, stackable treated via package 200 is formed simultaneously with a plurality of stackable treated via package 200 in an array or strip, e.g., a strip of four. A jig including a plurality of flat ended pins corresponding to upper interconnection balls 220 is pressed downward on the array or strip to simultaneously flatten all of upper interconnection balls 220 of the array or strip to form treated interconnection balls 640. The array or strip is singulated to form individual stackable treated via package 200.

Flat surfaces 642 are planar surfaces and lie in a planar seating plane 644, i.e., flat surfaces 642 are parallel and coplanar to one another. Flat surfaces 642 are exposed through via apertures 436 while the rest of treated interconnection balls 640 is enclosed within package body 334.

Although the entire upper surfaces of treated interconnection balls 640 are illustrated as flat surfaces 642, in other examples, only top portion of the upper surfaces of treated interconnection balls 640 are flat and the remaining lower portions are convex. In yet another example, treated interconnection balls 640 include concave surfaces.

In one embodiment, stackable treated via package 200 is warped, e.g., due to mismatch in stress generated by the various layers such as substrate 202 and package body 334. Stackable treated via package 200 is warped prior to performance of treat upper interconnection balls operation 114. For example, stackable treated via package 200 is warped at the stage illustrated in FIG. 5. Due to this warpage, upper interconnection balls 220 are not perfectly coplanar at the stage illustrated in FIG. 5.

In accordance with another embodiment, upper interconnection balls 220 are formed with a certain amount of tolerance and thus mismatch. Stated another way, some of upper interconnection balls 220 are larger than others of upper interconnection balls 220. For example, upper interconnection balls 220 vary slightly in size at the stage illustrated in FIG. 5. Due to this variation in size, upper interconnection balls 220 are not perfectly coplanar at the stage illustrated in FIG. 5.

Although warpage and size variation are set forth above as reasons for non-coplanarity of upper interconnection balls 220, in light of this disclosure, those of skill in the art will understand that upper interconnection balls 220 can be non-coplanar for other reasons.

Although non-coplanarity of upper interconnection balls 220 is set forth above in various examples, in another embodiment, upper interconnection balls 220 are coplanar prior to performance of treat upper interconnection balls 114.

However, regardless of whether upper interconnection balls 220 are coplanar or non-coplanar, after performance of treat upper interconnection balls operation 114, flat surfaces 642 lie in planar seating plane 644. Stated another way, after performance of treat upper interconnection balls operation 114, treated interconnection balls 640 provide a planar seating plane 644. By providing planar seating plane 644, bonding with interconnection balls of a stacked electronic component package is enhanced thus maximizing yield as discussed further below.

Figure 9A:
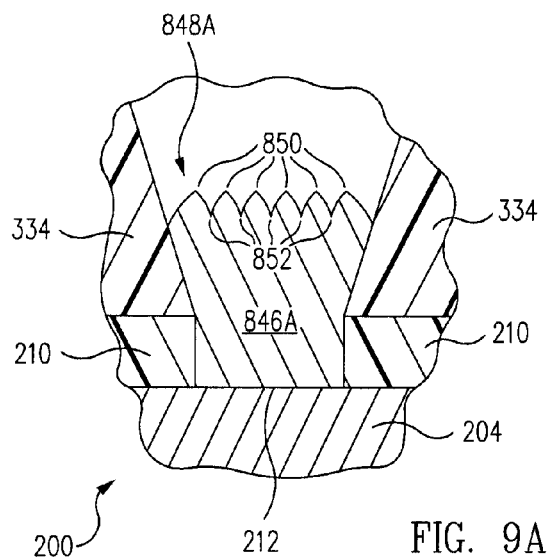
FIG. 9A is an enlarged cross-sectional view of the region IX of the stackable treated via package of FIG. 8.

FIG. 8 is a cross-sectional view of stackable treated via package 200 of FIG. 5 at a later stage during fabrication in accordance with another embodiment. FIG. 9A is an enlarged cross-sectional view of the region IX of stackable treated via package 200 of FIG. 8.

Referring now to FIGS. 1, 5, 8, and 9A together, from attach lower interconnection balls operation 112, flow moves to treat upper interconnection balls operation 114. In treat upper interconnection balls operation 114, upper interconnection balls 220 (FIG. 5) are treated to form treated interconnection balls 846 as illustrated in FIG. 8. Treated interconnection balls 846 include a first treated interconnection ball 846A.

More particularly, upper interconnection balls 220 (FIG. 5) are deformed to form treated interconnection balls 846. Treated interconnection balls 846 include upper, e.g., first, jagged surfaces 848. To illustrate, interconnection ball 846A includes a first jagged surface 848A of jagged surfaces 848. Jagged surfaces 848 are sometimes called treated surfaces.

In one embodiment, a jig includes a plurality of jagged ended pins. The jagged ended pins are passed through via apertures 436 and pressed downward on upper interconnection balls 220 to simultaneously deform all of upper interconnection balls 220 (FIG. 5) to form treated interconnection balls 846.

Illustratively, stackable treated via package 200 is formed simultaneously with a plurality of stackable treated via package 200 in an array or strip, e.g., a strip of four. A jig including a plurality of jagged ended pins corresponding to upper interconnection balls 220 is pressed downward on the array or strip to simultaneously deform all of upper interconnection balls 220 of the array or strip to form treated interconnection balls 846. The array or strip is singulated to form individual stackable treated via package 200.

Jagged surfaces 848 are sharply uneven surfaces, sometimes called roughened surfaces. Jagged surfaces 848 are exposed through via apertures 436 while the rest of treated interconnection balls 846 is enclosed within package body 334.

In one example, jagged surfaces 848 are hatched to include one or more alternating repeating peaks 850 and valleys 852. Peaks 850 jut out from (protrude from) treated interconnection balls 846. In the opposite manner, valleys 852 are recessed within treated interconnection balls 846. Jagged surfaces 848 are sometimes said to have projections which project from treated interconnection balls 846.

Figure 9B:
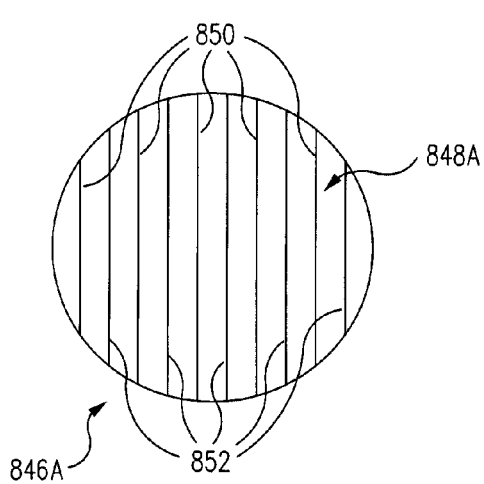
FIG. 9B is a top plan view of a treated interconnection ball of the stackable treated via package of FIGS. 8 and 9A in accordance with one embodiment.

FIG. 9B is a top plan view of treated interconnection ball 846A of FIGS. 8 and 9A in accordance with one embodiment. As illustrated in FIG. 9B, jagged surface 848A of treated interconnection ball 846A is hatched, sometimes called scratched or scored, with a series of parallel lines to form peaks 850 and valleys 852. More particularly, peaks 850 and valleys 852 are parallel to one another and extend lengthwise in a direction parallel with upper surface 202U of substrate 202.

Figure 9C:
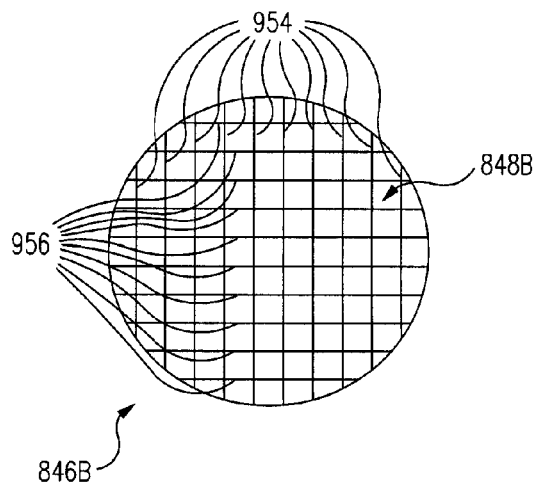
FIG. 9C is a top plan view of a treated interconnection ball in accordance with another embodiment.

FIG. 9C is a top plan view of a treated interconnection ball 846B in accordance with another embodiment. Treated interconnection ball 846B is similar to treated interconnection ball 846A of FIGS. 8 and 9A and only the significant differences are discussed below. As illustrated in FIG. 9C, a jagged surface 848B of treated interconnection ball 846B is cross-hatched, sometimes called scratched or scored, with a series of criss-cross (checkerboard) parallel lines 954, 956.

In light of this disclosure, those of skill in the art will understand that the descriptions of jagged surfaces 848A, 848B of FIGS. 9B, 9C generally apply to all jagged surfaces 848 of stackable treated via package 200 of FIG. 8 depending upon the particular embodiment. Although two examples of jagged surfaces 848A, 848B are provided in FIGS. 9B, 9C, in light of this disclosure, those of skill in the art will understand that jagged surfaces 848 can be roughened with other patterns. Generally, jagged surfaces 848 have a roughness (vertical deviations) greater than upper interconnection balls 220 (FIG. 5).

Referring again to FIG. 8, jagged surfaces 848 break the oxide layer of interconnection balls of an upper electronic component package stacked upon stackable treated via package 200 thus enhancing bonding therewith and maximizing yield. Although the entire upper surfaces of treated interconnection balls 846 are illustrated as jagged surfaces 848, in other examples, only top portions of the upper surfaces of treated interconnection balls 846 are jagged and the remaining lower portions are convex and smooth.

FIG. 10 is a cross-sectional view of an electronic component assembly 1000 including stackable treated via package 200 of FIGS. 6, 7 during fabrication in accordance with one embodiment. Referring now to FIG. 10, stackable via package 200 is stacked on a larger substrate 1070. Larger substrate 1070, e.g., a printed circuit motherboard, includes a dielectric substrate 1072 having an upper, e.g., first, surface 1072U and an opposite lower, e.g., second, surface 1072L.

Terminals 1074, e.g., of a circuit pattern, are formed on upper surface 1072U of substrate 1072. Although not illustrated, in light of this disclosure, those of skill in the art will understand that larger substrate 1070 can have additional and/or difference circuit patterns depending upon the particular application.

Larger substrate 1070 further includes an upper, e.g., first, solder mask 1076 on upper surface 1072U of substrate 1072 and a lower, e.g., second, solder mask 1078 on lower surface 1072L of substrate 1072. Upper solder mask 1076 is patterned to expose terminal 1074.

Solder structures 1080 are formed on terminals 1074. Illustratively, solder structures 1080 are formed of screen printed solder paste.

Lower interconnection balls 538 of stackable treated via package 200 are placed into contact (stacked on) respective solder structures 1080.

Further, an upper, e.g., second, electronic component package 1082 is stacked upon stackable treated via package 200. Upper electronic component package 1082 is sometimes called a stacked electronic component package.

Upper electronic component package 1082 includes a substrate 1002, an upper surface 1002U, a lower surface 1002L, upper traces 1004, lower traces 1006, vias 1008, an upper solder mask 1010, bond fingers 1014, a lower solder mask 1016, terminals 1018, an electronic component 1022, an active surface 1024, an inactive surface 1026, bond pads 1028, an adhesive 1030, bond wires 1032, a package body 1034, and lower interconnection balls 1038 similar to substrate 202, upper surface 202U, lower surface 202L, upper traces 204, lower traces 206, vias 208, upper solder mask 210, bond fingers 214, lower solder mask 216, terminals 218, electronic component 222, active surface 224, inactive surface 226, bond pads 228, adhesive 230, bond wires 232, package body 334, and lower interconnection balls 538 of stackable treated via package 200, respectively, and so the description thereof is not repeated here.

Lower interconnection balls 1038 of upper electronic component package 1082 are placed into via apertures 436 and upon flat surfaces 642 of treated interconnection balls 640. As flat surfaces 642 lie in a flat seating plane as discussed above, contact between lower interconnection balls 1038 of upper electronic component package 1082 and treated interconnection balls 640 is enhanced thus enhancing bonding therebetween.

In one embodiment, lower interconnection balls 538 and/or lower interconnection balls 1038 are flux dipped prior to stacking.

Although a particular upper electronic component package 1082 is illustrated and discussed, in light of this disclosure, those of skill in the art will understand that other upper electronic component packages can be stacked on stackable treated via package 200 in other embodiments. For example, an upper electronic component package includes an electronic component mounted in a flip chip configuration and/or multiple electronic components stacked one upon another or side by side.

Figure 11:
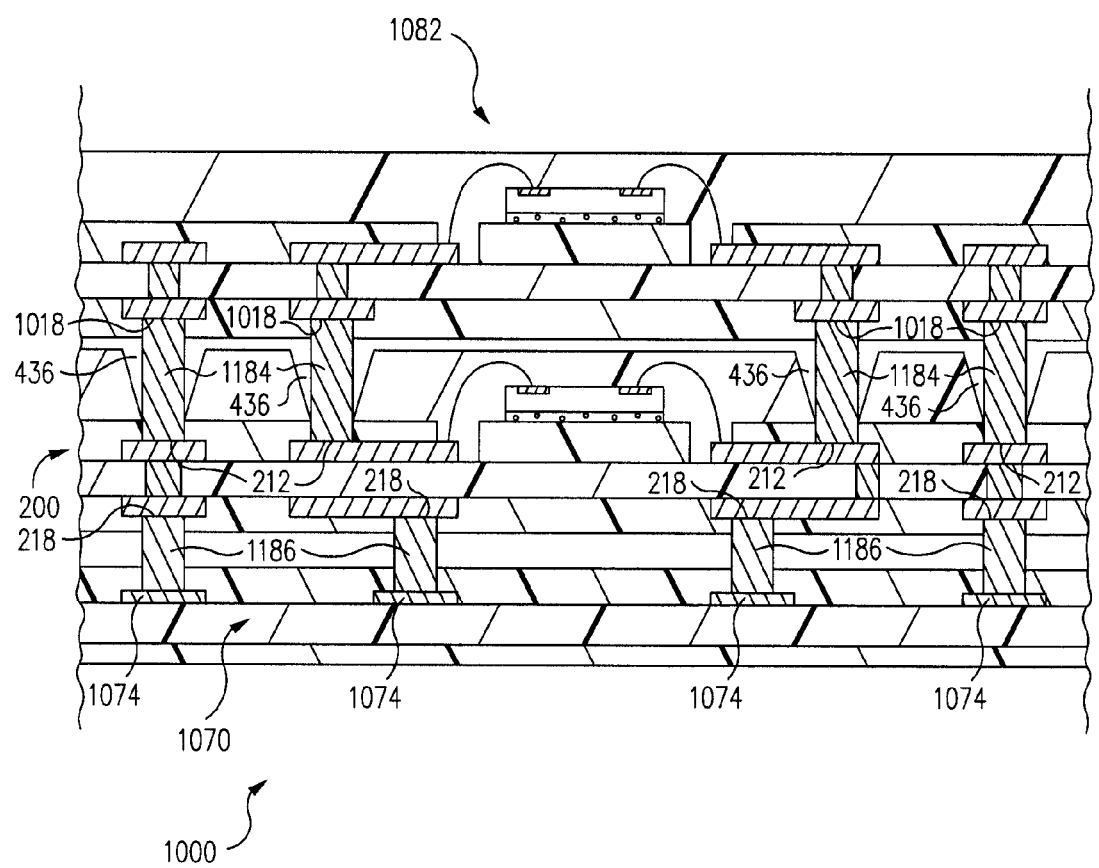
FIG. 11 is a cross-sectional view of the electronic component assembly of FIG. 10 at a later stage during fabrication in accordance with one embodiment.

FIG. 11 is a cross-sectional view of electronic component assembly 1000 of FIG. 10 at a later stage during fabrication in accordance with one embodiment. Referring now to FIGS. 10 and 11 together, assembly 1000 is heated to reflow, i.e., melt and resolidify, lower interconnection balls 1038, treated interconnection balls 640, lower interconnection balls 538, and solder structures 1080.

More particularly, lower interconnection balls 1038 and treated interconnection balls 640, e.g., solder, are heated to melt lower interconnection balls 1038 and treated interconnection balls 640. Upon melting, lower interconnection balls 1038 and treated interconnection balls 640 combine (intermix) into molten structures, e.g., molten solder. During melting, treated interconnection balls 640 dome up enhancing intermixing of lower interconnection balls 1038 and treated interconnection balls 640 to form the molten structures. These molten structures cool and form solder columns 1184. In accordance with this embodiment, solder columns 1184 are integral, i.e., are single unitary structures and not a plurality of different layers connected together.

Solder columns 1184 extend through via apertures 436 and between lower terminals 1018 of upper electronic component package 1082 and terminals 212 of stackable treated via package 200. In one example, upper electronic component package 1082 is mounted and electrically connected to stackable treated via package 200 by solder columns 1184.

Further, during the reflow, lower interconnection balls 538 and solder structures 1080, e.g., solder, are heated to melt lower interconnection balls 538 and solder structures 1080. Upon melting, lower interconnection balls 538 and solder structures 1080 combine (intermix) into molten structures, e.g., molten solder. These molten structures cool and form solder columns 1186. In accordance with this embodiment, solder columns 1186 are integral, i.e., are single unitary structures and not a plurality of different layers connected together.

Solder columns 1186 extend between lower terminals 218 of stackable treated via package 200 and terminals 1074 of larger substrate 1070. In one example, stackable treated via package 200 is mounted and electrically connected to larger substrate 1070 by solder columns 1186.

Although electronic component assembly 1000 including treated interconnection balls 640 is illustrated in FIG. 10, in another example, electronic component assembly 1000 includes treated interconnection balls 846 of FIG. 8 instead of treated interconnection balls 640. In accordance with this example, referring now to FIGS. 8, 10, and 11 together, lower interconnection balls 1038 of upper electronic component package 1082 are placed into via apertures 436 and upon jagged surfaces 848 of treated interconnection balls 846.

During reflow, treated interconnection balls 846, i.e., jagged surfaces 848, break the oxide layer of lower interconnection balls 1038 of upper electronic component package 1082 thus enhancing bonding therewith. More particularly, lower interconnection balls 1038 and treated interconnection balls 846, e.g., solder, are heated to melt lower interconnection balls 1038 and treated interconnection balls 846. Upon melting, lower interconnection balls 1038 and treated interconnection balls 846 combine (intermix) into molten structures, e.g., molten solder. During melting, jagged surface 848 break the oxide layer of lower interconnection balls 1038 enhancing intermixing of lower interconnection balls 1038 and treated interconnection balls 846 to form the molten structures. These molten structures cool and form solder columns 1184.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A structure comprising:
a substrate;
a terminal coupled to the substrate;
a treated interconnection ball coupled to the terminal;
an electronic component coupled to the substrate; and
a package body enclosing the electronic component, the package body comprising a via aperture extending through the package body to expose a treated surface of the treated interconnection ball.

2. The structure of claim 1 wherein the treated surface comprises a flat surface.

3. The structure of claim 1 wherein the treated interconnection ball is one of a plurality of treated interconnection balls.

4. The structure of claim 3 wherein the treated interconnection balls comprise treated surfaces.

5. The structure of claim 4 wherein the treated surfaces comprise flat surfaces.

6. The structure of claim 5 wherein the flat surfaces are parallel and coplanar to one another.

7. The structure of claim 1 wherein the treated surface comprises a jagged surface.

8. The structure of claim 7 wherein the jagged surface is a sharply uneven surface.

9. The structure of claim 7 wherein the jagged surface is a roughened surface.

10. The structure of claim 7 wherein the jagged surface comprises peaks and valleys.

11. The structure of claim 10 wherein the peaks protrude from the treated interconnection ball and the valleys are recessed within the treated interconnection ball.

12. The structure of claim 7 wherein the jagged surface is cross-hatched with a series of lines.

13. A structure comprising:
a stackable treated via package comprising:
an electronic component;
treated interconnection balls comprising treated surfaces; and
a package body enclosing the electronic component, the package body comprising via apertures exposing the treated surfaces; and
a stacked electronic component package stacked upon the stackable treated via package.

14. The structure of claim 13 wherein the treated surfaces comprise flat surfaces, the flat surfaces being parallel and coplanar to one another.

15. The structure of claim 13 wherein the treated surfaces comprise jagged surfaces.

16. The structure of claim 13 wherein the stacked electronic component package comprises interconnection balls placed within the via apertures and upon the treated surfaces.

17. A method comprising:
coupling an interconnection ball to a terminal coupled to a substrate;
attaching an electronic component to the substrate;
encapsulating the electronic component and the interconnection ball in a package body;
forming a via aperture in the package body to expose the interconnection ball; and
treating the interconnection ball to form a treated interconnection ball comprising a treated surface.

18. The method of claim 17 wherein the treating comprises flattening the interconnection ball, the treated surface comprising a flat surface.

19. The method of claim 17 wherein the treating comprises deforming the interconnection ball, the treated surface comprising a jagged surface.

* * * * *